United States Patent
Gaiser et al.

(10) Patent No.: US 9,954,157 B2
(45) Date of Patent: Apr. 24, 2018

(54) THERMOELECTRIC GENERATOR FOR EXHAUST SYSTEMS AND CONTACT MEMBER FOR A THERMOELECTRIC GENERATOR

(71) Applicant: Eberspächer Exhaust Technology GmbH & Co. KG, Neunkirchen (DE)

(72) Inventors: Gerd Gaiser, Reutlingen (DE); Fabian Frobenius, Esslingen (DE); Matthias Hense, Remshalden (DE)

(73) Assignee: Eberspächer Exhaust Technology GmbH & Co. KG, Neunkirchen (DE)

( * ) Notice: Subject to any disclaimer, the term of this patent is extended or adjusted under 35 U.S.C. 154(b) by 0 days.

(21) Appl. No.: 15/617,306

(22) Filed: Jun. 8, 2017

(65) Prior Publication Data
US 2017/0358727 A1 Dec. 14, 2017

(30) Foreign Application Priority Data
Jun. 9, 2016 (DE) .......................... 10 2016 110 625

(51) Int. Cl.
*H01L 35/32* (2006.01)
*H01L 35/30* (2006.01)
*F01N 5/02* (2006.01)

(52) U.S. Cl.
CPC .............. *H01L 35/32* (2013.01); *F01N 5/025* (2013.01); *H01L 35/30* (2013.01)

(58) Field of Classification Search
CPC .......................................... H01L 35/00–35/34
See application file for complete search history.

(56) References Cited

U.S. PATENT DOCUMENTS

| 3,197,342 A * | 7/1965 | Neild, Jr. ................. H01L 35/32 136/210 |
| 4,065,936 A | 1/1978 | Fenton et al. |
| 6,028,263 A * | 2/2000 | Kobayashi .............. H01L 35/00 136/201 |

(Continued)

FOREIGN PATENT DOCUMENTS

| DE | 10 2009 048192 A1 | 4/2011 |
| EP | 1 475 532 A2 | 11/2004 |

(Continued)

*Primary Examiner* — Golam Mowla
(74) *Attorney, Agent, or Firm* — McGlew and Tuttle, P.C.

(57) ABSTRACT

A thermoelectric generator includes a first channel for passing a warm fluid along a direction of flow, a second channel for passing a cold fluid, a plurality of thermocouple elements disposed along the direction of flow between the first and second channels, a first member includes portions disposed between the elements and the first channel and associated with the individual elements for providing a heat coupling between the associated element and the first channel, and a second member including portions disposed between the elements and the second channel and associated with the individual elements for providing a heat coupling between the associated element and the second channel. The sum of the thermal resistances of those portions that are associated with a first element positioned upstream of a second element is bigger than the sum of the thermal resistances of those portions that are associated with the second element.

20 Claims, 6 Drawing Sheets

(56) References Cited

U.S. PATENT DOCUMENTS

| | | | |
|---|---|---|---|
| 6,073,449 A * | 6/2000 | Watanabe | H01L 35/30 62/3.2 |
| 9,680,400 B2 * | 6/2017 | Lang | H01L 35/32 |
| 2001/0013224 A1 * | 8/2001 | Ohkubo | |
| 2002/0139123 A1 | 10/2002 | Bell | |
| 2005/0217714 A1 | 10/2005 | Nishijima et al. | |
| 2006/0157102 A1 * | 7/2006 | Nakajima | F01N 5/025 136/205 |
| 2006/0225448 A1 * | 10/2006 | Feger | B63J 99/00 62/238.6 |
| 2009/0151768 A1 * | 6/2009 | Forseth | F24H 1/0045 136/207 |
| 2010/0024859 A1 * | 2/2010 | Bell | F01N 5/025 136/201 |
| 2011/0082607 A1 * | 4/2011 | Chorian | B60K 6/445 701/22 |
| 2011/0113767 A1 | 5/2011 | Richter | |
| 2011/0155202 A1 * | 6/2011 | Arnold | H01L 35/32 136/224 |
| 2011/0239635 A1 | 10/2011 | Prior et al. | |
| 2013/0000285 A1 * | 1/2013 | Prior | B23K 1/0012 60/320 |
| 2013/0206200 A1 * | 8/2013 | Khuc | F01N 5/025 136/212 |
| 2013/0319492 A1 | 12/2013 | Richter | |
| 2013/0340801 A1 * | 12/2013 | Zhang | H01L 35/30 136/201 |
| 2014/0034102 A1 * | 2/2014 | Ranalli | H01L 35/30 136/201 |

FOREIGN PATENT DOCUMENTS

| | | |
|---|---|---|
| EP | 1 912 030 A1 | 4/2008 |
| EP | 2 274 508 B1 | 10/2011 |
| JP | H07-12009 A | 1/1995 |
| JP | 2016-131213 A | 7/2016 |
| WO | 2008/155406 A2 | 12/2008 |
| WO | 2009/138158 A1 | 11/2009 |
| WO | 2011042080 A1 | 4/2011 |

* cited by examiner

THERMOELECTRIC GENERATOR FOR EXHAUST SYSTEMS AND CONTACT MEMBER FOR A THERMOELECTRIC GENERATOR

CROSS REFERENCE TO RELATED APPLICATIONS

This application claims the benefit of priority under 35 U.S.C. § 119 of German Application DE 10 2016 110 625.9, filed Jun. 9, 2016, the entire contents of which are incorporated herein by reference.

FIELD OF THE INVENTION

The present invention relates to a thermoelectric generator configured for converting thermal energy contained in a warm fluid (for example, in the exhaust gas of a vehicle driven by an internal combustion engine) at least partly into electric energy. In this way, the overall efficiency of systems, were the thermal energy contained in the warm fluid represents loss, is improved. For a vehicle, this results in a reduction of fuel consumption and emissions per kilometer. The present invention relates further to a contact member for such thermoelectric generator.

BACKGROUND OF THE INVENTION

A thermoelectric generator (TEG) converts heat (more precisely a heat flow passing through the thermoelectric generator) directly into electrical energy. In this respect, a thermoelectric generator is made from a plurality of thermocouple elements (often also called "thermoelectric modules") (TEM) mounted between a cold side and a warm side of the thermoelectric generator and electrically connected in series and/or in parallel. The thermocouple elements effect the actual conversion of the thermal energy into electric energy. The conversion can be based on different effects (e.g., the Seebeck effect or the Thomson effect). For providing a thermal conductivity between the cold and the warm sides and the thermocouple elements, the thermoelectric generator often comprises one or more contact members made from a material with high thermal conductivity. Such contact members serve, in particular, to even out asperities and to thereby enable thermal conduction at the entire surface of the thermocouple elements.

The range of the operation temperature within which known thermocouple elements have a reasonable efficiency is relatively narrow. Within the operation temperature range, the efficiency of the thermocouple elements is defined by the temperature difference between the cold side and the warm side. The efficiency has inter alia an impact on the (electric) voltage provided by a thermocouple element. Common thermocouple elements are basically comprised of $Bi_2Te_3$, PbTe, SiGe, BiSb or $FeSi_2$.

When using a thermoelectric generator, it is of importance to integrate the sensitive (in particular sensitive to pressure) thermocouple elements into the fluid flow (e.g. exhaust tract of a vehicle driven by an internal combustion engine) such that the maximum usable temperature difference is applied to surfaces of the thermocouple elements, while the back pressure for the fluid may not be increased or only slightly increased, because increase in the back pressure also results in an increase of the energy required for the transport of the fluid (and thus also of the fuel consumption of a vehicle driven by an internal combustion engine). Finally, it is desirable to operate the thermocouple elements, if possible, in an operation temperature range where they exhibit a reasonable efficiency. When used in vehicles, these problems are also difficult to solve due to the confined spaces in or below the vehicles.

A use of thermoelectric generators in exhaust systems of vehicles driven by an internal combustion engine is known from the prior art. For examples, it is referred to EP 1 475 532 A2, JP H07-012009 A, and WO 2009/138158 A1.

From WO 2009/138158 A1 it is known to cool the thermoelectric generators employed by coupling their cold side to a coolant circuit. Further, it is known from WO 2009/138158 A1 to increase the thermal absorption from the hot exhaust gas at the warm side of the employed thermoelectric generators using fins. The density of the fins or the type of fins employed should thereby vary along the direction of flow of an exhaust gas stream for achieving a lower thermal conductivity for thermocouple elements at an upstream region of the hot exhaust gas stream than for thermocouple elements at a downstream region of the hot exhaust gas stream.

A disadvantage of prior art systems is that often a number of thermoelectric generators configured for different operation temperature ranges are used in combination with bypasses for the warm fluid in order to allow a use of a broad temperature range of the warm fluid, when the temperature of the warm fluid varies. Bypasses, however, require a lot of space and are expensive, due to the plurality of thermoelectric generators employed.

Further, one of the problems with prior art systems is often that thermocouple elements of a thermoelectric generator that are arranged in tandem/in series along the direction of flow of the warm fluid experience different temperature differences due to the thermal energy being extracted from the warm fluid. This results in the thermocouple elements generating different electric voltages (and providing different output) accounting for a complex configuration of a connected power electronic.

In addition, prior art systems have the problem that any thermal overloading of thermocouple elements of a thermoelectric generator located upstream along the warm fluid is to be prevented.

Finally, fitting a thermoelectric generator is laborious due to the plurality of components (thermocouple elements and contact members).

SUMMARY OF THE INVENTION

Embodiments provide a compact thermoelectric generator for converting thermal energy contained in a fluid into electric energy that has a particularly wide range of the operation temperature and that is easy to manufacture.

Further embodiments provide a compact thermoelectric generator for converting thermal energy contained in a fluid into electric energy, in which all thermocouple elements forming the thermoelectric generator receive substantially the same thermal flow. Substantially, the same thermal flow hereby refers to a thermal flow where the power of the thermal flow delivered to the individual thermocouple elements differs by less than 20% and in particular by less than 10%. Consequently, the power of the thermocouple elements is also about the same.

Further embodiments provide a compact thermoelectric generator for converting thermal energy contained in a fluid into electric energy that prevents the thermocouple elements upstream of the warm fluid from being thermally overloaded.

Further embodiments provide a contact member suitable for the thermoelectric generator and simplifying the installation effort.

Embodiments of a thermoelectric generator comprise a first flow channel for passing a warm fluid, a second flow channel for passing a cold fluid, a plurality of thermocouple elements disposed between the first flow channel and the second flow channel, a first contact member located between the plurality of thermocouple elements and a wall of the first flow channel, and a second contact member located between the plurality of thermocouple elements and a wall of the second flow channel. The first flow channel comprises an inlet and an outlet, thereby defining a first direction of flow for the warm fluid. The warm fluid thus enters the first flow channel through the inlet of the first flow channel and exits the first flow channel through its outlet. Accordingly, also the second flow channel comprises an inlet and an outlet, thereby defining a second direction of flow for the cold fluid. The cold fluid thus enters the second flow channel through the inlet of the second flow channel and exits the second flow channel through its outlet. A number of thermocouple elements of the plurality of thermocouple elements are disposed between the first flow channel and the second flow channel such that they are neighboring each other in pairs along the first flow direction (thus resulting in a serial arrangement of the thermocouple elements along the first flow direction). Neighboring thermocouple elements may thereby be directly adjacent to each other or be spaced apart. The first contact member disposed between the plurality of thermocouple elements and the wall of the first flow channel comprises contact portions associated with the individual thermocouple elements providing a heat conducting coupling between the respective thermocouple element and the wall of the first flow channel. This heat conducting coupling has a thermal resistance and may promote (in case of a comparatively low thermal resistance) or impede (in case of a comparatively high thermal resistance) thermal conduction. Accordingly, also the second contact member disposed between the plurality of thermocouple elements and the wall of the second flow channel comprises contact portions associated with the individual thermocouple elements providing a heat conducting coupling between the respective thermocouple element and the wall of the second flow channel. This heat conducting coupling has a thermal resistance and may promote (in case of a comparatively low thermal resistance) or impede (in case of a comparatively high thermal resistance) thermal conduction. The sum of the thermal resistances of those contact portions of the first and second contact members that are associated with a first thermocouple element located, with respect to the first direction of flow, upstream of a second thermocouple element (and thus closer to the inlet for the warm fluid) is larger than the sum of the thermal resistances of those contact portions of the first and second contact members that are associated with the second thermocouple element (located farther from the inlet for the warm fluid).

The adjective "warm" with respect to the fluid passing the first flow channel means, as used herein, that the temperature of the fluid is higher than that of the "cold" fluid passing the second flow channel.

Further, the term "flow channel" as used herein generally refers to a body for passing a fluid flow, like for instance a pipe line. The cross-section of the body passing the fluid flow is preferably constant.

The term "thermocouple element" as used herein refers to an electric device enabling a direct conversion of heat into electric energy.

Finally, the term "thermal resistance" as used herein refers to the inverse of the product of the heat transition coefficient of the respective contact portion of the respective contact member and the size of the transition area. The heat transition coefficient may be determined by determining the heat amount transferred through the respective contact portion during a period of time, whereby according to an embodiment a temperature difference is used for the temperature difference in front and behind the respective contact portion at which the associated thermocouple element exhibits the highest efficiency. Alternatively, the temperature difference between 800° C. (warm side) and 300° C. (cold side) may be used for determining the heat transition coefficient.

The above configuration allows the thermoelectric generator to operate in higher temperatures for the warm fluid than in the prior art, since a thermal overload of thermocouple elements disposed near the inlet of the first flow channel can be prevented by deliberately providing a correspondingly high thermal resistance for the contact portion associated with the respective thermocouple elements of the first contact member. This also results in a particularly wide range of operating temperatures for the thermoelectric generator without any requirement for bypasses.

In addition, a proper adjustment of the respective sums of the thermal resistances of the contact portions of the first and second contact members associated with thermocouple elements disposed along the first direction of flow to the temperatures, flow rates and thermal capacities of the warm and cold fluids may ensure that the heat amount (thermal flow) transferred between the first flow channel and the second flow channel through the first thermocouple element is approximately the same as the heat amount transferred between the first flow channel and the second flow channel through the second thermocouple element (and each thermocouple element disposed downstream (subsequently) along the first direction of flow). This enables to provide each of the thermocouple elements disposed successively along the first direction of flow with about the same temperature difference and thus an operation within the same efficiency range. This results in an almost identical output of the thermocouple elements. Since the thermocouple elements then also provide an almost identical electric voltage, the configuration of a connected power electronics is simplified.

According to an embodiment, the different thermal resistances of the first contact member are effected by the thickness of the first contact member at the contact portion between the first thermocouple element and the first flow channel being larger than the thickness of the first contact member at the contact portion between the second thermocouple element (and optionally each thermocouple element disposed downstream (subsequently) along the first flow direction) and the first flow channel. This requires, however, differing distances between the thermocouple elements and the first flow channel. The first thermocouple element is then located farther away from the wall of the first flow channel than thermocouple elements disposed downstream along the first direction of flow.

According to an embodiment, the different thermal resistances of the first contact member are effected by the first contact member comprising a lower content of substances with high thermal conductivity in the contact portion between the first thermocouple element and the first flow channel than in the contact portion between the second thermocouple element (and optionally each thermocouple element disposed downstream (subsequently) along the first flow direction) and the first flow channel. Accordingly, the material composition of the first contact member in the contact portion associated with the first thermocouple element differs from the material composition of the first contact member in the contact portion associated with the second thermocouple element. The first contact member may, e.g., be provided with a higher content of a material having a comparatively low thermal conductivity in the contact portion associated with the first thermocouple element than in the contact portion associated with the second thermocouple element.

According to an embodiment, the different thermal resistances of the first contact member are effected by the effective cross-sectional area of the first contact member at the contact portion between the first thermocouple element and the first flow channel being smaller than the effective cross-sectional area of the first contact member between the second thermocouple element (and optionally each thermocouple element disposed downstream (subsequently) along the first flow direction) and the first flow channel. The effective cross-sectional area of the first contact member according to an embodiment is hereby determined half way between the wall of the first flow channel and the associated thermocouple element. The effective cross-sectional area may for instance be manipulated by forming cavities or recesses into the respective contact portion of the first contact member, which all in all also results in different densities of the contact portions of the first contact member.

According to an embodiment, the different thermal resistances of the first contact member are effected by the size of the surface of the contact portion of the first contact member that contacts the first thermocouple element being smaller than the size of the surface of the contact portion of the first contact member that contacts the second thermocouple element (or optionally each thermocouple element disposed downstream along the first flow direction). For example, recesses may be provided in the contact portion of the first contact member that penetrate the first contact member in the respective contact portion between the wall of the first flow channel and the associated thermocouple element completely. In this case, an adjustment of the thermal resistance may be effected by the number and size of the recesses in the respective contact portion of the first contact member.

According to embodiments, the different thermal resistances of the second contact member in the contact portions may also be effected by one or more of the measures described above with respect to the first contact member: For example, the thickness of the second contact member at the contact portion between the first thermocouple element and the second flow channel may differ from the thickness of the second contact member at the contact portion between the second thermocouple element and the second flow channel resulting also in this case in different distances of the first and second thermocouple elements to the second flow channel. Alternatively or additionally, the second contact member may be provided with a content of substances having a high thermal conductivity at the contact portion between the first thermocouple element and the second flow channel that differs from a content of substances having a high thermal conductivity at the contact portion between the second thermocouple element and the second flow channel, thus resulting in the material composition of the second contact member at the contact portion associated with the first thermocouple element being different to the material composition of the second contact member at the contact portion associated with the second thermocouple element. Alternatively or additionally, the effective cross-sectional area of the second contact member at the contact portion between the first thermocouple element and the second flow channel may differ from the effective cross-sectional area of the second contact member at the contact portion between the second thermocouple element and the second flow channel, the effective cross-sectional area of the second contact member according to an embodiment being also in this case determined half way between a wall of the second flow channel and the associated thermocouple element. Alternatively or additionally, the size of the surface of the contact portion of the second contact member that contacts the first thermocouple element may be different to the size of the surface of the contact portion of the second contact member that contacts the second thermocouple element. Also in this case, the second thermocouple element is a symbolic representation for each thermocouple element disposed with respect to the first direction of flow downstream (subsequently) of the first thermocouple element.

The above measures can be implemented easily and at low cost, and enable a precise trimming of the respective thermal resistances.

According to an embodiment, at least one of the first and second contact members between the contact portion associated with the first thermocouple element and the contact portion associated with second thermocouple element comprises an isolation region, where the thermal resistance is increased by at least five times and in particular by at least ten times as compared to an average thermal resistance.

According to an embodiment the thermal resistance of the contact member at (in) the isolation region between the contact portion associated with the first thermocouple element and the contact portion associated with the second thermocouple element is increased by less than 10,000 times and especially by less than 1,000 times and further especially by less than 100 times as compared to an average thermal resistance of the neighboring contact portions of the contact member. Thus, in this embodiment the following ranges are possible: five times increase≤thermal resistance at the isolation region <10,000 times increase; five times increase≤thermal resistance at the isolation region <1,000 times increase; five times increase≤thermal resistance at the isolation region <100 times increase; ten times increase≤thermal resistance at the isolation region <10,000 times increase; ten times increase≤thermal resistance at the isolation region <1,000 times increase; ten times increase thermal resistance at the isolation region <100 times increase.

This allows to reduce or even prevent any unwanted thermal flow between thermocouple elements neighboring each other in the direction of flow across the respective contact members.

According to an embodiment, the first contact member comprises in at least one contact portion a recess which largest dimension is oriented along the first direction of flow. According to an embodiment, the recess is an elongated hole. According to an embodiment, the second contact member comprises in at least one contact portion a recess which largest dimension is oriented along the second direction of flow. According to an embodiment, the recess is an elongated hole.

In doing so, the heat flow flowing through the contact portions of the respective contact member can be provided with a preferential direction oriented along the direction of flow of the respective fluid. This helps to provide the surfaces of the thermocouple elements along the direction of flow of the respective fluid with temperatures of substantially the same height, since inside the contact members a thermal conduction along the directions of flow of the respective fluids is not suppressed or not substantially suppressed.

According to an embodiment, the first contact member comprises between the contact portion associated with the first thermocouple element and the contact portion associated with the second thermocouple element at least one recess with its largest dimension being aligned transverse to the first direction of flow. According to an embodiment, the recess is an elongated hole. According to an embodiment, the second contact member comprises between the contact portion associated with the first thermocouple element and the contact portion associated with the second thermocouple element at least one recess with its largest dimension being aligned transverse to the first direction of flow. According to an embodiment, the recess is an elongated hole.

This allows to prevent any unwanted thermal flow between thermocouple elements neighboring each other in the direction of flow of the respective fluid across the respective contact members almost entirely.

According to an embodiment, the thermal resistance of the first contact member is, in the contact portion associated with the first thermocouple element, higher than the thermal resistance of the first contact member in the contact portion associated with the second thermocouple element.

This ensures that a thermal overload of the thermocouple elements located near the inlet of the first flow channel for the warm fluid is prevented.

According to an embodiment, the thermal resistance of the second contact member is, in the contact portion associated with the first thermocouple element, higher than the thermal resistance of the second contact member in the contact portion associated with the second thermocouple element, when the first direction of flow and the second direction of flow have the same orientation, and the thermal resistance of the second contact member is, in the contact portion associated with the first thermocouple element, lower than the thermal resistance of the second contact member in the contact portion associated with the second thermocouple element, when the first direction of flow and the second direction of flow are oriented oppositely.

According to an embodiment, the wall of the first flow channel, on which the first contact member is deposited, is smooth and has no cooling fins. According to an alternative embodiment, the wall of the first flow channel, on which the first contact member is deposed, has cooling fins that are evenly distributed along the first direction of flow. According to an embodiment, the wall of the second flow channel, on which the second contact member is deposed, is smooth and has no cooling fins. According to an alternative embodiment, the wall of the second flow channel, on which the second contact member is deposed, has cooling fins that are evenly distributed along the second direction of flow. According to an embodiment, the cooling fins are provided at the side of the wall of the respective flow channel that is in contact with the fluid and not in contact with the respective contact member. Thus, the cooling fins are provided inside the respective flow channel.

The use of flow channels having smooth walls and the omission of cooling fins disposed inside the flow channels avoids an increase of the flow resistance for the fluids passing through the flow channels and thus avoids a reduction of the overall efficiency by flow losses. Otherwise, a provision of cooling fins increases the area available for thermal conduction. An even distribution of the cooling fins along the respective directions of flow then ensures that the area available for a heat transfer is about the same over the entire extension of the respective flow channel. Then, also the flow resistance is about the same over the entire extension of the respective flow channel.

According to an embodiment, all contact portions are provided by the first contact member in a monobloc configuration. According to an embodiment, all contact portions are provided by the second contact member in a monobloc configuration.

A monobloc configuration of the contact member and the corresponding contact portions eases an assembling of the thermoelectric generator, since the number of parts used is kept low. Furthermore, a monobloc configuration allows a fixed specification of the contact portion's sequential arrangement.

According to an embodiment, the plurality of thermocouple elements is disposed as a single layer between the first flow channel and the second flow channel.

According to an embodiment, the first thermocouple element and the second thermocouple element (i.e., thermocouple elements disposed adjacent to each other along the first direction of flow) are, in pairs, identical in construction with respect to each other or all thermocouple elements of the plurality of thermocouple elements are identical in construction with respect to each other.

According to an embodiment, the first contact member is a heat conducting film made of graphite or silicone rubber or polyimide or alumina or micanite or acrylic polymer. According to an embodiment, the second contact member is a heat conducting film made of graphite or silicone rubber or polyimide or alumina or micanite or acrylic polymer.

By introducing holes into these materials, contact portions with different thermal resistances can be provided with ease.

Embodiments of the thermoelectric generator have no bypass conduits.

Embodiments of an alternative thermoelectric generator comprise a flow channel having an inlet and an outlet for passing a fluid, the inlet and the outlet of the flow channel defining a direction of flow for the fluid. The thermoelectric generator comprises a plurality of thermocouple elements, disposed neighboring each other in the direction of flow next to the flow channel. Further, the thermoelectric generator comprises a contact member located between the plurality of thermocouple elements and a wall of the flow channel, the contact member comprising contact portions each of which is associated with a single thermocouple element, the contact portions providing a thermal conducting coupling between the respective associated thermocouple element and the wall of the flow channel. Between directly adjacent contact portions associated with directly adjacent thermocouple elements, the contact member thereby comprises an isolation region at (in) which the thermal resistance of the directly adjacent contact portions is increased by at least five times and, in particular, at least ten times as compared to an average thermal resistance of the directly adjacent contact portions of the contact member.

According to an embodiment the thermal resistance of the contact member at (in) the isolation region between directly adjacent contact portions associated with directly adjacent thermocouple elements is increased by less than 10,000 times and especially by less than 1,000 times and further especially by less than 100 times as compared to an average thermal resistance of the directly adjacent contact portions of the contact member. Thus, in this embodiment the following ranges are possible: five times increase≤thermal resistance at the isolation region <10,000 times increase; five times increase≤thermal resistance at the isolation region <1,000 times increase; five times increase≤thermal resistance at the isolation region <100 times increase; ten times increase≤thermal resistance at the isolation region <10,000 times increase; ten times increase≤thermal resistance at the isolation region <1,000 times increase; ten times increase-≤thermal resistance at the isolation region <100 times increase.

By providing a respective isolation region, a thermal flow between neighboring thermocouple elements across the contact member may be reduced or prevented completely. Further, using a monobloc contact member reduces the assembly effort.

According to an embodiment, the directly adjacent thermocouple elements are then configured for different temperature regions. This allows to avoid a thermal overload of the thermocouple elements, since also across the contact member no thermal flow between neighboring thermocouple elements is possible.

According to an embodiment, the contact member comprises between the contact portion associated with the first thermocouple element and the contact portion associated with a neighboring second thermocouple element at least one recess whose largest dimension is orientated transverse to the direction of flow. According to an embodiment, the recess is an elongated hole.

This allows to prevent an unwanted thermal flow between thermocouple elements neighboring each other in the directions of flow of the respective fluids across the respective contact members almost entirely.

Embodiments of an exhaust system for a vehicle driven by an internal combustion engine comprise a thermoelectric generator as described above, wherein the first flow channel is an exhaust gas line of the exhaust system or is configured for being coupled with an exhaust gas line of the exhaust system.

Embodiments of a contact member for a thermoelectric generator comprise a plurality of contact portions configured to provide a heat conducting coupling between a respective associated adjacent thermocouple element of a thermoelectric generator and an adjacent wall of a flow channel. The contact member thereby comprises an isolation region between neighboring contact portions associated with thermocouple elements neighboring each other, with thermal resistance at (in) the isolation region being increased by at least five times and, in particular, by at least ten times as compared to the average thermal resistance of the neighboring contact portions. This may for instance be implemented using a different material composition for the contact member in the isolation region or by the contact member comprising a density or material thickness in the isolation region lower than in the neighboring contact portions. Alternatively, the contact member may comprise a recess (or several recesses) between neighboring contact portions associated with neighboring thermocouple elements, the largest dimension of the recesses being oriented along the direction of a separation line between neighboring contact portions. The recess may for example be an elongated hole or a number of (circular) holes disposed along a line.

According to an embodiment the thermal resistance of the contact member at (in) the isolation region between neighboring contact portions associated with thermocouple elements neighboring each other is increased by less than 10,000 times and especially by less than 1,000 times and further especially by less than 100 times as compared to an average thermal resistance of the neighboring contact portions of the contact member. Thus, in this embodiment the following ranges are possible: five times increase≤thermal resistance at the isolation region <10,000 times increase; five times increase≤thermal resistance at the isolation region <1,000 times increase; five times increase≤thermal resistance at the isolation region <100 times increase; ten times increase≤thermal resistance at the isolation region <10,000 times increase; ten times increase≤thermal resistance at the isolation region <1,000 times increase; ten times increase-≤thermal resistance at the isolation region <100 times increase.

This allows a reduction or a prevention of a thermal flow between neighboring thermocouple elements across the contact member.

According to an embodiment, the contact member has the shape of a rectangle with two long sides in parallel and two short sides in parallel, and a recess is provided between neighboring contact portions associated with neighboring thermocouple elements, with the largest dimension of the recess oriented in parallel to the short sides of the contact member.

According to an embodiment, the contact member provides all contact portions in a monobloc configuration.

According to an embodiment, the contact member is a heat conducting film made of graphite or silicone rubber or polyimide or alumina or micanite or acrylic polymer.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

Further features of the invention will be apparent from the following description of exemplary embodiments together with the claims and the Figures. In the Figures, equal or similar elements are assigned equal or similar reference signs. It is noted that the invention is not limited to the configurations of the exemplary embodiments described herein, but defined by the scope of the claims enclosed. Embodiments according to the invention may in particular implement individual features in different numbers and combination than the examples described below. In the following description of an exemplary embodiment, reference is made to the enclosed Figures.

DESCRIPTION OF EXEMPLARY EMBODIMENTS

Referencing FIGS. 1A to 1C, a first embodiment of a thermoelectric generator 7 and corresponding contact members 4, 5 will now be described. FIG. 1B thereby shows a cross-section taken along line A-A through the thermoelectric generator shown in FIG. 1A in perspective view, while FIG. 1C shows a plan view of the first and second contact members 4, 5 used in the thermoelectric generator of FIGS. 1A and 1B.

Figure 1A:
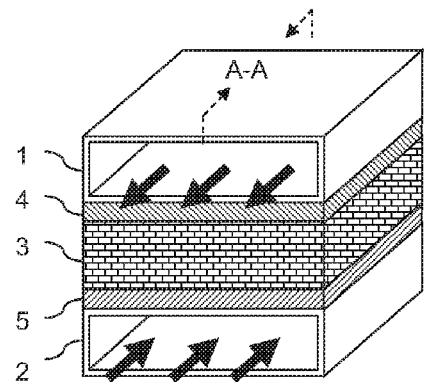
FIG. 1A is a schematic perspective view of a thermoelectric generator according to a first embodiment.
Figure 1B:
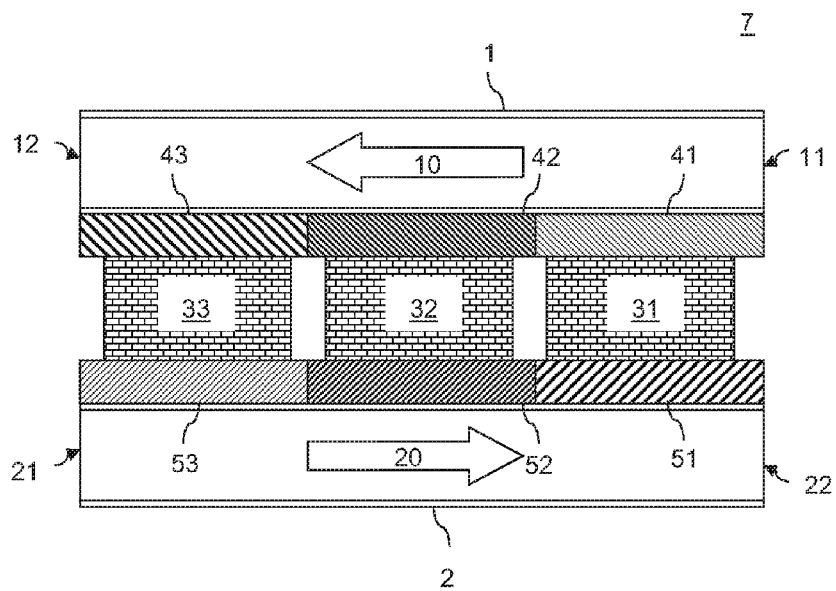
FIG. 1B is a schematic cross-sectional view of the thermoelectric generator of FIG. 1A.
Figure 1C:
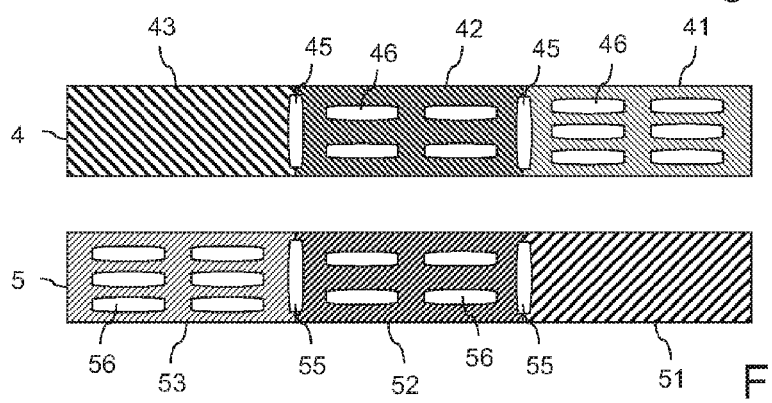
FIG. 1C is a schematic plan view of the first and second contact members used in the thermoelectric generator of FIG. 1A.

As shown particularly clearly in FIGS. 1A and 1B, the thermoelectric generator 7 comprises a first flow channel 1, in the Figures arranged at the top, and a second flow channel 2, in the Figures arranged at the bottom. In the embodiment shown, both flow channels 1 and 2 are made from stainless steel sheets and have a constant rectangular cross-section each.

In the embodiment shown, an 800° C. warm exhaust flow entering the first flow channel 1 through an inlet 11 located in FIG. 1B at the right side and exiting the first flow channel 1 through an outlet 12 located in FIG. 1B at the left side passes through the upper first flow channel 1 along a direction of flow 10 indicated by arrows. A 40° C. warm, and thus comparatively cold, air flow entering the second flow channel 2 through an inlet 21 located in FIG. 1B at the left side and exiting the second flow channel 2 through an outlet 22 located in FIG. 1B at the right side passes through the bottom second flow channel 2 along a direction of flow 20 indicated by arrows. In the embodiment shown, the first direction of flow 10 and the second direction of flow 20 are apparently oriented opposite so that the warm exhaust flow passed inside the top first flow channel 1 and the cold air flow passed inside the bottom flow channel 2 flow through the thermoelectric generator 7 in counter flow.

Between the first and second flow channels 1, 2 three thermocouple elements 31, 32, and 33, identical in construction, are arranged in a plane 3 such that they are arranged along the first and second direction of flow 10, 20 in a single layer neighboring each other in a row. Thereby, a small gap is present between the respective directly neighboring thermocouple elements 31, 32, and 33. The thermal coupling between a wall of the first flow channel 1 and the thermocouple elements 31, 32, and 33 disposed in plane 3 is provided by a first contact member 4, which is in the present embodiment a heat conducting film made from micanite. The thermal coupling between the thermocouple elements 31, 32, and 33 disposed in plane 3 and the wall of the second flow channel 2 is established by a second contact member 5, which is in the present embodiment a heat conducting film made from graphite. The temperature difference between the 800° C. hot exhaust flow and the 40° C. cold air flow results in a heat flow between the two flow channels 1, 2 that passes through the first contact member 4, the thermocouple elements 31, 32, and 33, and the second contact member 5.

The first contact member 4 and the second contact member 5 thereby have a thermal resistance that varies along the first and second direction of flow 10, 20.

As can be seen especially well in the plan view of the first and second contact members 4, 5 of FIG. 1C, the micanite heat conducting film forming the first contact member 4 is divided in three contact portions 41, 42, and 43 by two elongated holes 45 extending through the first contact member 4 in its depth direction completely and having their largest dimension oriented transverse to the first direction of flow 10. These recesses configured as elongated holes 45 guarantee that the thermal conductivity of the first contact member 4 between the respective neighboring contact portions 41 and 42 or 42 and 43, respectively, is close to zero. The graphite heat conducting film forming the second contact member 5 is also divided into three contact portions 51, 52, and 53 by two elongated holes 55 spaced along the second direction of flow 20 and extending completely through the second contact member 5 in its depth direction. Also in this case, the recesses configured as elongated holes 55 are oriented such that their largest dimension is oriented transverse to the direction of flow 20 thereby preventing thermal conduction between the respective neighboring contact portions 51 and 52 or 52 and 53, respectively, to a great extent.

Each contact portion 41, 42, 43, 51, 52, 53 of the first and second contact members 4, 5 is associated with one thermocouple element 31, 32, 33. The first and second contact member 4, 5 each have different thermal resistances in their respective contact portions 41, 42, 43, 51, 52, 53. In the embodiment shown, this is achieved with the contact portions 41 and 42 of the micanite heat conducting film forming the first contact member 4 having different numbers of recesses which are each formed as an elongated hole 46. The largest dimension of the elongated holes 46 is thereby oriented along the first direction of flow 10 to facilitate thermal conduction along the first direction of flow 10 inside the respective contact portion 41 and 42. Due to having the highest number of elongated holes 46, the first contact member 4 has the smallest effective cross-sectional area in the contact portion 41, and in the contact portion 43, having no recesses, the highest effective cross-sectional area. Furthermore, the surface of the first contact element 4 that contacts the first thermocouple element 31 at the contact portion 41 is the smallest and the surface contacting the third thermocouple element 33 at the contact portion 43 is the largest.

Accordingly, also the contact portions 52 and 53 of the graphite heat conducting film forming the second contact member 5 have different numbers of recesses that are each formed by an elongated hole 56. Also here, this results in the effective cross-sectional area and the size of the surface of the second contact member 5 contacting the first thermocouple element 31 are at the contact portion 51 the largest and at contact portion 53 the smallest.

The contact portions 41 and 51, 42 and 52, 43 and 53 of the first and second contact members 4, 5 which each are associated with a thermocouple element 31, 32, and 33 are balanced with respect to their respective thermal resistance such that the sum of the thermal resistances of the contact portions 41 and 51 of the first and second contact members 4 and 5 associated with the first thermocouple element 31 is higher than the sum of the thermal resistances of the contact portions 42 and 52 of the first and second contact members 4 and 5 associated with the second thermocouple element 32, which in turn is higher than the sum of the thermal resistances of the contact portions 43 and 53 of the first and second contact members 4 and 5 associated with the third thermocouple element 33. Thus, the sum of the thermal resistances of the contact portions 41, 42, 43, 51, 52, 53 of the first and second contact members 4 and 5 decreases along the first direction of flow 10. This balancing is performed by the choice of materials, the first and second contact member 4, 5 are made from and also by the arrangement, size and number of recesses formed in the contact portions 41, 42, 52, 53. By deliberately providing a comparatively high thermal resistance for the first thermocouple element 31 located along the first direction of flow 10 closest to the inlet 11 of the first flow channel 1 a good protection of this first thermocouple element 31 against thermal overload is achieved.

Further, since the thermal resistance of the second contact member 5 is, in the contact portion 51 associated with the first thermocouple element 41, lower than the thermal resistance of the second contact portion 52 associated with the second thermocouple element 32, a good heat conduction between the first thermocouple element 31 and the wall of the second flow channel 2 is further guaranteed, resulting in the heat amount transferred from the first thermocouple element 31 can all in all be adjusted to equal the heat amount transferred by the second and third thermocouple elements 32 and 33.

Since in the embodiment shown, the contact portions 41, 42, and 43 of the first contact member 4 and the contact portions 51, 52, and 53 of the second contact member 5 are each provided in a monobloc configuration, assembling the contact members 4, 5 with the corresponding contact portions 41, 42, 43, 51, 52, 53 is easy. Further the arrangement of the contact portions 41, 42, 43, 51, 52, 53 with the different thermal resistances is fixed, preventing failures during assembly.

In the embodiments shown, the interior walls of both flow channels 1, 2 are smooth at their sides facing/adjoining the thermocouple element 31, 32, 33 and thus formed without any cooling fins, resulting in the first and second flow channel 1 and 2 having a very low flow resistance.

Although the first and second contact members 4, 5 of the embodiment shown in FIGS. 1A to 1C are made from different materials, the present invention is not limited thereto. Alternatively, the first and second contact members 4 and 5 may also be made from the same material.

Figure 2A:
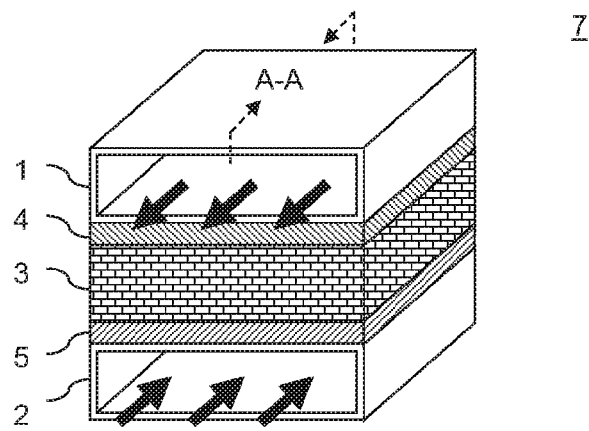
FIG. 2A is a schematic perspective view of a thermoelectric generator according to a second embodiment.
Figure 2B:
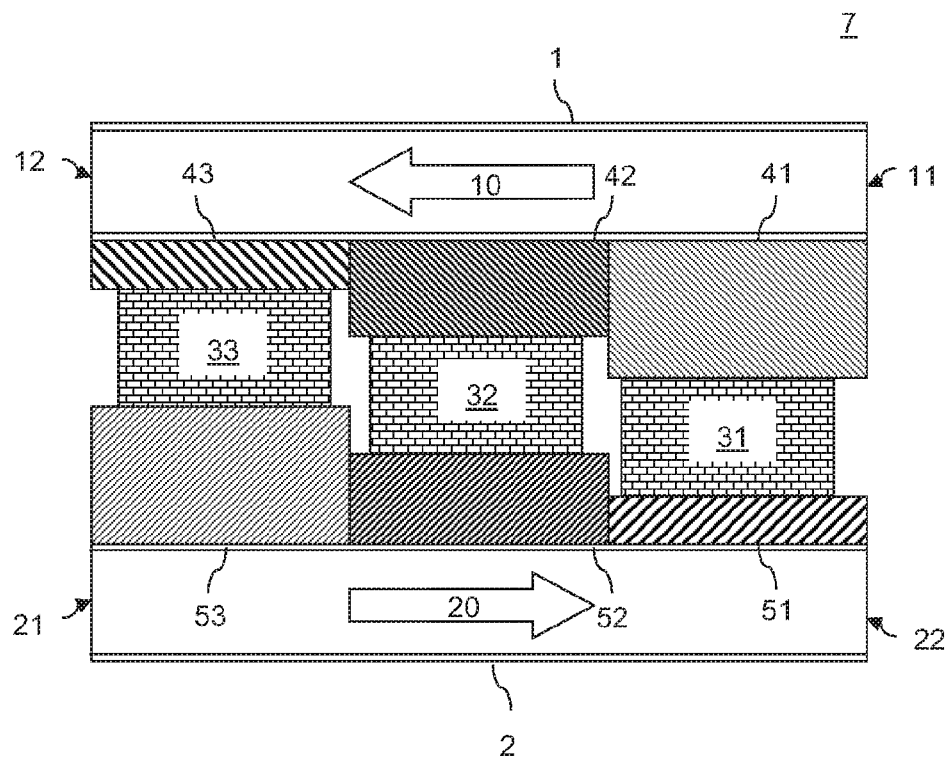
FIG. 2B is a schematic cross-sectional view of the thermoelectric generator of FIG. 2A.

Referencing FIGS. 2A and 2B, a second embodiment of the present invention will be described below. To avoid any repetitions thereby, only differences to the first embodiment described with reference to FIGS. 1A to 1C are addressed. Also here, FIG. 2B shows a cross-sectional view taken along line A-A in FIG. 2A which shows the thermoelectric generator 7 in a perspective view.

The thermoelectric generator 7 according to the second embodiment differs from the thermoelectric generator 7 of the above first embodiment in that each of the first and second contact member 4 and 5 according to the second embodiment are formed without recesses. Instead, the different thermal resistances in the contact portion 41 of the contact member 4 associated with the first thermocouple element 31, in the contact portion 42 of the contact member 4 associated with the second thermocouple element 32, and in the contact portion 43 of the contact member 4 associated with the third thermocouple element 31, are achieved by having the thickness of the first contact member 4 being decreased along the first direction of flow 10. Thus, the thickness of the first contact member 4 is the largest in the contact portion 41 associated with the thermocouple element 31 positioned to be the first upstream of the first direction of flow 10, and the smallest in the contact portion 43 associated with the thermocouple element 33 positioned to be the last downstream along the first direction of flow 10. To nevertheless ensure a constant distance between the first and second flow channels 1 and 2, the thicknesses of the second contact member 5 in the contact portions 51, 52, and 53 are exactly complementary to those of the first contact member 4.

This results in the first thermocouple element 31 located farthest upstream along the first direction of flow 10 being furthest from a wall of the first flow channel 1 and closest to a wall of the second flow channel 2 and the third thermocouple element 33 located farthest downstream along the first direction of flow 10 being closest to the wall of the first flow channel 1 and furthest from the wall of the second flow channel 2.

For providing the different material thicknesses of the first and second contact member 4 and 5, the contact portions 4 and 5 of the embodiment shown are formed from silicone rubber with different amounts of porcelain beads added, the silicone rubber being printed onto the respective first and second flow channels 1 and 2. Also in this embodiment, neighboring thermocouple elements 31 and 32 as well as 32 and 33 are, in pairs, identical in construction. Also in this embodiment, the sum of the thermal resistances of the contact portions 41 and 51, 42 and 52, 43 and 53 associated with a thermocouple element 31, 32, 33 decreases along the first direction of flow 10.

Referencing FIGS. 3A to 3C, a third embodiment of a thermoelectric generator 7 and of corresponding contact members 4, 5 will be described below. To avoid any unnecessary repetitions, reference is made to the above embodiments and only differences are addressed in detail.

Figure 3A:
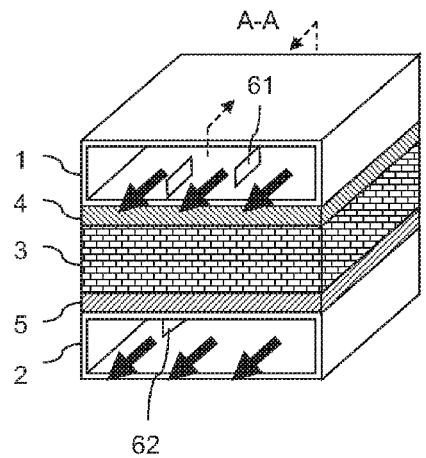
FIG. 3A is a schematic perspective view of a thermoelectric generator according to a third embodiment.
Figure 3B:
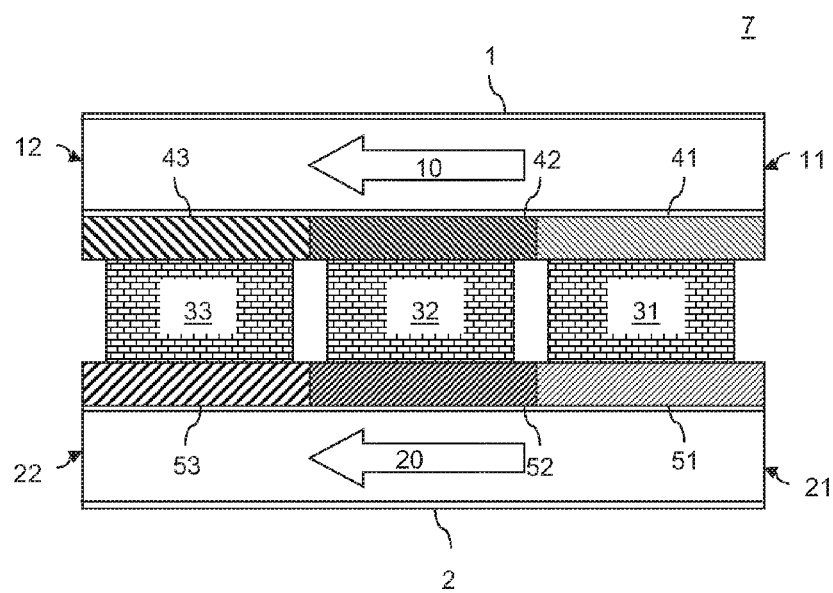
FIG. 3B is a schematic cross-sectional view of the thermoelectric generator of FIG. 3A.

As can be seen particularly well from FIG. 3A, the walls of the first and second flow channels 1 and 2 of the embodiment shown in there each comprise cooling fins 61 and 62 at their sides facing the thermocouple elements 31, 32, 33, the cooling fins being evenly distributed along each of the first direction of flow 10 and the second direction of flow 20. This results in the area of the walls of the first and second flow channels 1 and 2 available for heat transmission being larger.

Different than in the above first and second embodiments, the first direction of flow 10 and the second direction of flow 20 are in the third embodiment oriented in the same direction, resulting in the first and second flow channels 1 and 2 being operable in parallel flow.

Thereby, contact portions 41 and 51 of the first and second contact members 4 and 5 are respectively associated with the first thermocouple element 31 positioned farthest upstream along the first and second directions of flow 10, 20, which have the highest thermal resistance, and contact portions 43 and 53 of the first and second contact members 4 and 5 are respectively associated with the third thermocouple element 33 positioned farthest downstream, which have the lowest thermal resistance.

Figure 3C:
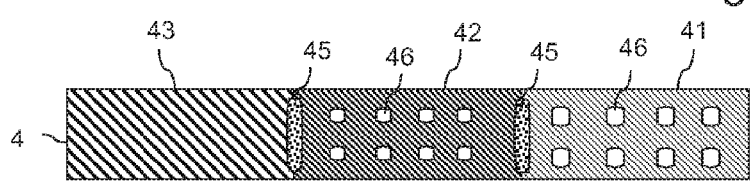
FIG. 3C is a schematic plan view of the first and second contact elements used in the thermoelectric generator of FIG. 3A.
Figure 3C:
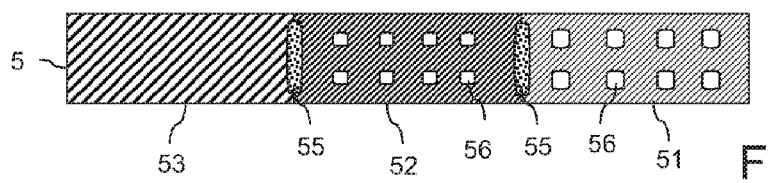

As can quite well be seen from FIG. 3C, the thermal resistances of the first and second contact members 4 and 5, which are in this embodiment each formed of acrylic polymer, are adjusted by forming recesses 46 and 56, respectively, therein. However, in the embodiment shown herein, the thermal resistance is not varied by the number of recesses 46 and 56 as in the first embodiment, but by the size of the respective recesses 46 and 56.

Further, in the third embodiment, the contact portions 41, 42 and 43 of the first contact member 4 and the contact portions 51, 52 and 53 of the second contact member 5 are-different to the first embodiment-not divided by elongated holes, but by regions 45 and 55, in which the first and second contact members 4 and 5 show a heavily increased content of a substance with low thermal conductivity. In the embodiment shown, this substance of low thermal conductivity is alumina. This results in the thermal resistance of the regions 45 and 55 between respective neighboring contact portions 41 and 42, and 42 and 43, respectively, and 51 and 52, and 52 and 53, respectively, being in the embodiment shown 11 times higher than the average thermal resistance of the respective adjacent contact portions.

The technique for adjusting the material composition for varying the thermal resistance used in portions 45 and 55 may alternatively also be used to adjust the thermal resistance of contact portions 41, 42, and 43 of the first contact member 4 and/or the contact portions 51, 52, and 53 of the second contact member 5.

Referencing FIG. 4, a fourth embodiment of the thermoelectric generator 7 will be described below. Thereby, only differences to the first embodiment are addressed in detail, and for the rest reference is made to the description of the first embodiment.

Figure 4:
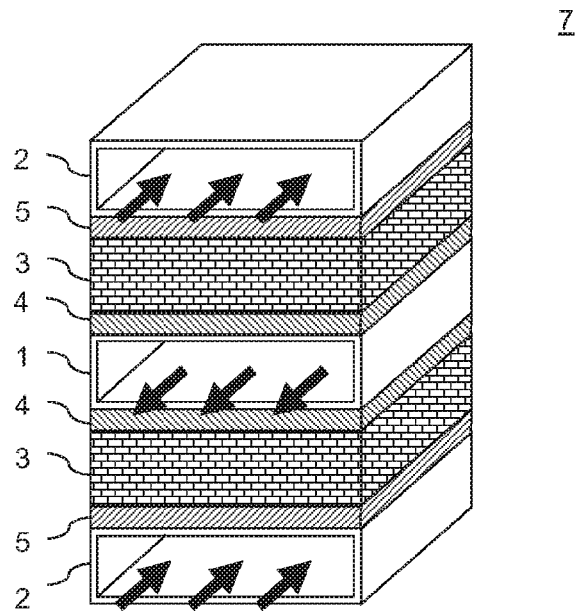
FIG. 4 is a schematic perspective view of a thermoelectric generator according to a fourth embodiment.

The forth embodiment shown in FIG. 4 differs from the first embodiment shown in FIGS. 1A to 1C in that two second flow channels 2 passing the cold air flow are provided, between which the first flow channel 1 passing the warm exhaust flow is disposed. Respective thermocouple elements 3 are disposed between the first flow channel 1 and the neighboring second flow channels 2, and a thermal conduction between the first flow channel 1 and the thermocouple elements 3 is respectively provided by a first contact layer 4. The thermal conduction between the thermocouple elements 3 and the respective neighboring second flow channel 2 is respectively provided by second contact members 5. The configuration shown in FIG. 4 enables a particularly effective usage of the energy of the warm exhaust flow passed in the first flow channel 1.

Referencing FIG. 5, a fifth embodiment of the thermoelectric generator 7 will be described below. Thereby, only differences to the fourth embodiment are addressed, and for the rest reference is made to the description above of the previous embodiments.

Figure 5:
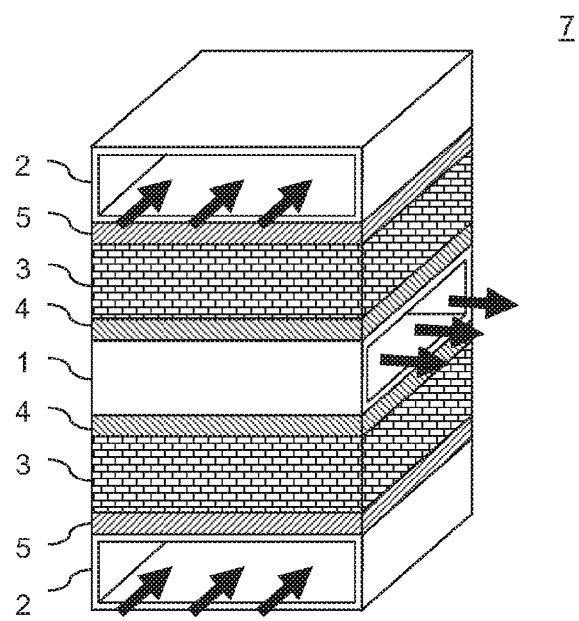
FIG. 5 is a schematic perspective view of a thermoelectric generator according to a fifth embodiment.

The thermoelectric generator 7 shown in FIG. 5 differs from the thermoelectric generator 7 shown in FIG. 4 only in that the generator is not passed through in counter flow but in cross flow. Accordingly, the thermocouple elements 3 disposed in a single layer between the first flow channel 1 and the two second flow channels 2 are disposed in several parallel rows.

Referencing FIG. 6, an embodiment of an exhaust system 8 using the thermoelectric generator 7 according to the embodiment shown in FIG. 5 is described below.

Figure 6:
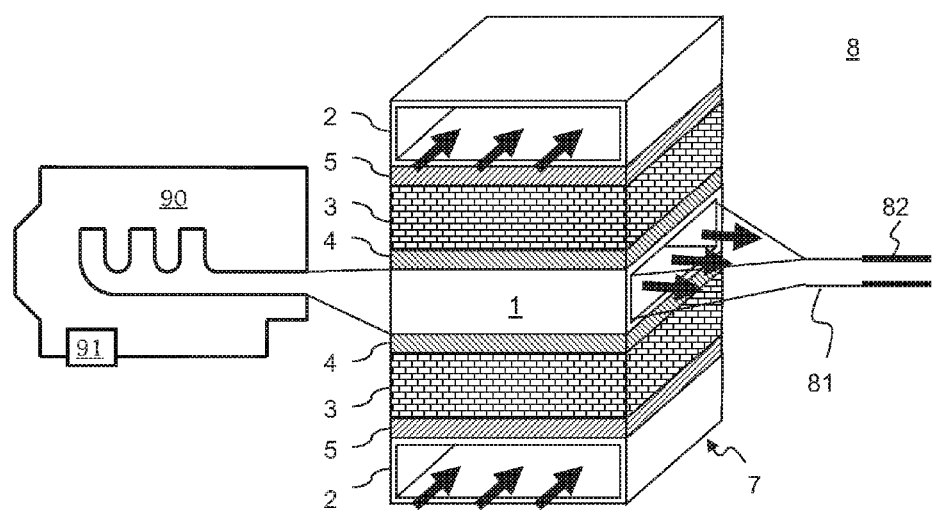
FIG. 6 is a schematic diagram of an exhaust system using the thermoelectric generator according to the fifth embodiment.

As apparent from FIG. 6, the exhaust gas generated by an internal combustion engine 90 having an engine control 91 is passed into the thermoelectric generator 7 through the inlet of the first flow channel 1. The outlet of the first flow channel 1 is coupled to the exhaust system 8 by an exhaust gas line 81, the exhaust gas line 81 ending in a tail pipe 82.

It is appreciated that the exhaust system 8 may further include a silencer or an emission control system or the like; for the sake of convenience, these components are not illustrated.

Figure 7A:
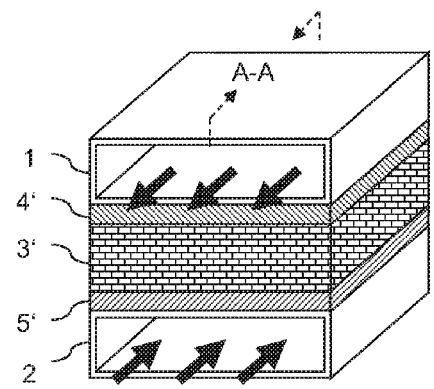
FIG. 7A is a perspective view of a thermoelectric generator according to a sixth embodiment.
Figure 7B:
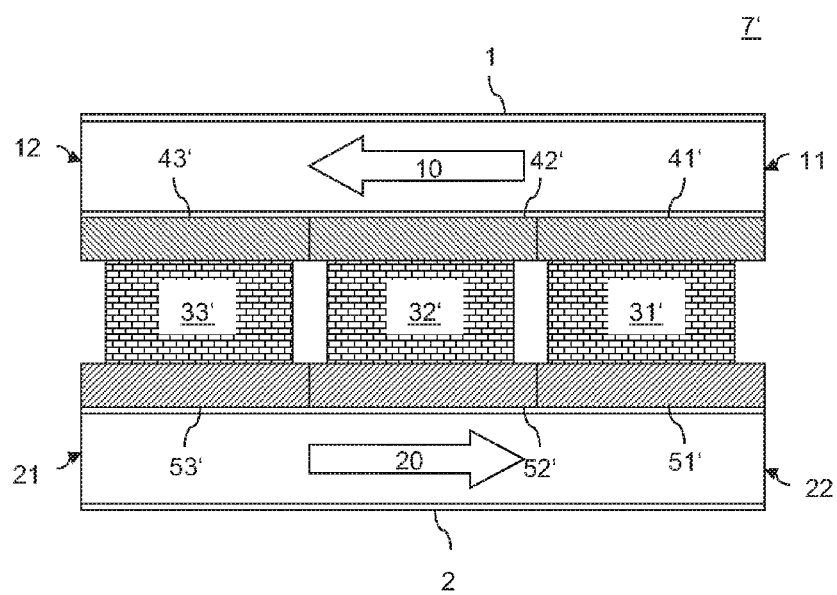
FIG. 7B is a schematic cross-sectional view of the thermoelectric generator of FIG. 7A.
Figure 7C:
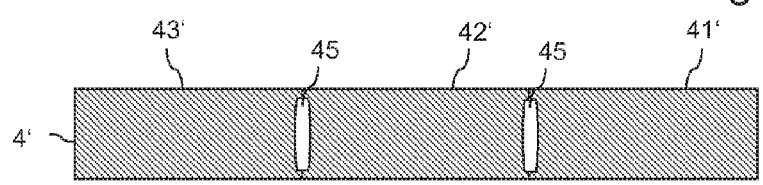
FIG. 7C is a schematic plan view of first and second contact elements used in the thermoelectric generator of FIG. 7A.
Figure 7C:
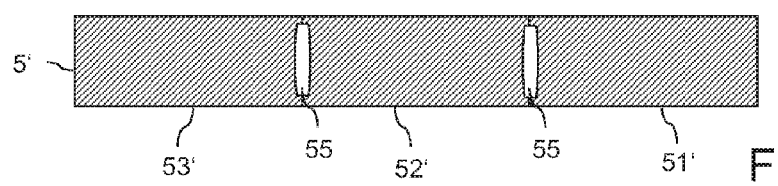

Referencing FIGS. 7A to 7C, a sixth embodiment of the thermoelectric generator 7' will be described below. To avoid any repetitions thereby, only differences to the first embodiment described with reference to FIGS. 1A to 1C are addressed, and for the rest reference is made to the above description.

The thermoelectric generator 7' and the corresponding contact members 4' and 5' of the sixth embodiment differs from the thermoelectric generator 7 and the corresponding contact members 4, 5 of the first embodiment in that the first and second contact members 4' and 5' each have the same thermal conductivity in their contact portions 41', 42', 43', 51', 52', and 53' associated with the thermocouple elements 31', 32', and 33'. Accordingly, the first and second contact members 4' and 5' have no elongated holes or the like within their contact portions 41', 42', 43', 51', 52', and 53'. Instead, only elongated holes 45 and 55 are provided which divide the contact members 4' and 5' into the contact portions 41', 42', 43', 51', 52' and prevent a thermal conduction between neighboring thermocouple elements 31', 32', and 33' across the contact members 4' and 5' to occur. With an exception of the elongated holes 45 and 55, the two contact members 4' and 5' are made from a micanite heat conducting film of constant material and thickness.

In contrast, the thermocouple elements 31', 32', and 33' are, in this embodiment, not identical in construction, but configured for different temperature ranges. Specifically, the first thermocouple element 31' located along the first direction of flow 10 closest to the inlet 11 of the first flow channel 1 has its highest efficiency at a temperature difference from 700° C. at the first flow channel 1 to 200° C. at the second flow channel 2, and the second thermocouple element 32' located downstream along the first direction of flow 10 has its highest efficiency at a temperature difference from 650° C. at the first flow channel 1 to 150° C. at the second flow channel 2.

Accordingly, an adaptation to different temperature differences is achieved in the present embodiment by a corresponding choice of thermocouple elements 3', with the elongated holes 45, 55 in the contact members 4' and 5' preventing a heat flow between neighboring thermocouple elements 3' across the contact members 4' and 5'. Furthermore, a simple assembly of the thermoelectric generator 7' is possible due to the monobloc configuration of contact members 4' and 5'.

It is noted that a description of the electric wiring of the thermocouple elements and the corresponding power electronic has been omitted for the above embodiments, since these are not relevant for the understanding of the functionality of the present invention. For the same reason a detailed explanation of the passage of the cold air flow charging the two flow channels 2 has been omitted in FIG. 6.

While the above embodiments of the present invention have been described by way of example only, it is apparent to those skilled in the art that numerous modifications, additions and substitutions can be made without departing from the scope and gist of the invention disclosed in the following claims.

Accordingly, the thermoelectric generator according to the invention is in principle suited for converting thermal energy contained in any fluid into electric energy and is thus not limited to the thermal energy contained in the exhaust gas of a vehicle driven by an internal combustion engine.

While specific embodiments of the invention have been shown and described in detail to illustrate the application of the principles of the invention, it will be understood that the invention may be embodied otherwise without departing from such principles.

What is claimed is:

1. A thermoelectric generator comprising:
   a first flow channel comprising a first flow channel wall and having an inlet and an outlet for passing a warm fluid, the inlet and the outlet of the first flow channel defining a first direction of flow for the warm fluid;
   a second flow channel comprising a second flow channel wall and having an inlet and an outlet for passing a cold fluid, the inlet and the outlet of the second flow channel defining a second direction of flow for the cold fluid;
   a plurality of thermocouple elements disposed between the first flow channel and the second flow channel and being disposed adjacent to each other along the first direction of flow;
   a first contact member disposed between the plurality of thermocouple elements and the first flow channel wall, the first contact member comprising first contact member contact portions, each of the first contact member contact portions being associated with a respective individual one of the thermocouple elements, the first contact member contact portions providing a heat conducting coupling between the respectively associated thermocouple elements and the wall of the first flow channel; and
   a second contact member disposed between the plurality of thermocouple elements and the second flow channel wall, the second contact member comprising second contact member contact portions, each of the second contact member contact portions being associated with a respective individual one of thermocouple elements, the second contact member contact portions providing a heat conducting coupling between the respectively associated thermocouple elements and the wall of the second flow channel, wherein:
   a first thermocouple element of the plurality of thermocouple elements is positioned along the first direction of flow upstream of a second thermocouple element of the plurality of thermocouple elements; and
   a sum of thermal resistances of one of the first contact member contact portions associated with the first thermocouple element and one of the second contact member contact portions associated with the first thermocouple element, is larger than a sum of thermal resistances of one of the first contact member contact portions associated with the second thermocouple element and one of the second contact member contact portions associated with the second thermocouple element.

2. The thermoelectric generator according to claim 1, wherein different thermal resistances of the first contact member at the first contact member contact portions are based on one or more of the following:
   the first contact member contact portion between the first thermocouple element and the first flow channel has a thickness that is greater than a thickness of the first contact member contact portion between the second thermocouple element and the first flow channel;
   the first contact member contact portion between the first thermocouple element and the first flow channel has a content of substances having a high thermal conductivity that is lower than that of the first contact member contact portion between the second thermocouple element and the first flow channel;
   the first contact member contact portion between the first thermocouple element and the first flow channel has an effective cross-sectional area that is smaller than an effective cross-sectional area of the first contact member contact portion between the second thermocouple element and the first flow channel; and
   the first contact member contact portion between the first thermocouple element and the first flow channel has a surface size, contacting the first thermocouple element, that is smaller than a surface size, contacting the second thermocouple element, of the first contact member contact portion between the second thermocouple element and the first flow channel.

3. The thermoelectric generator according to claim 1, wherein different thermal resistances of the second contact member at the second contact member contact portions are based on one or more of the following:
   the second contact member contact portion between the first thermocouple element and the second flow channel has a thickness that is greater than a thickness of the second contact member contact portion between the second thermocouple element and the second flow channel;
   the second contact member contact portion between the first thermocouple element and the second flow channel has a content of substances having a high thermal conductivity that is lower than that of the second contact member contact portion between the second thermocouple element and the second flow channel;
   the second contact member contact portion between the first thermocouple element and the second flow channel has an effective cross-sectional area that is smaller than an effective cross-sectional area of the second contact member contact portion between the second thermocouple element and the second flow channel; and
   the second contact member contact portion between the first thermocouple element and the second flow channel has a surface size, contacting the second thermocouple element, that is smaller than a surface size, contacting the second thermocouple element, of the second contact member contact portion between the second thermocouple element and the second flow channel.

4. The thermoelectric generator according to claim 1, wherein:
   at least one of the first contact member and the second contact member comprises an isolation region between the contact portion associated with the first thermocouple element and the contact portion associated with the second thermocouple element, the isolation region having an increased thermal resistance by at least five times with respect to an average thermal resistance of adjacent contact portion; or
   at least one of the first contact member and the second contact member comprises an isolation region between the contact portion associated with the first thermocouple element and the contact portion associated with the second thermocouple element, the isolation region having an increased thermal resistance by at least ten times with respect to an average thermal resistance of adjacent contact portion.

5. The thermoelectric generator according to claim 1, wherein
   the first contact member comprises at least one recess in at least one of the first contact member contact portions, with a largest dimension of the at least one recess being oriented in the first direction of flow; or
   the second contact member comprises at least one recess in at least one of the second contact member contact portions, with a largest dimension of the at least one recess being oriented in the second direction of flow; or the first contact member comprises at least one recess in at least one of the first contact member contact portions, with a largest dimension of the at least one recess being oriented in the first direction of flow and the second contact member comprises at least one recess in at least one of the second contact member contact portions, with a largest dimension of the at least one recess being oriented in the second direction of flow.

6. The thermoelectric generator according to claim 1, wherein
the first contact member comprises at least one recess between the contact portion associated with the first thermocouple element and the contact portion associated with the second thermocouple element, the at least one recess having a largest dimension oriented transverse to the first direction of flow; or
the second contact member comprises at least one recess between the contact portion associated with the first thermocouple element and the contact portion associated with the second thermocouple element, the at least one recess having a largest dimension oriented transverse to the second direction of flow; or
the first contact member comprises at least one recess between the contact portion associated with the first thermocouple element and the contact portion associated with the second thermocouple element, the at least one recess having a largest dimension oriented transverse to the first direction of flow and the second contact member comprises at least one recess between the contact portion associated with the first thermocouple element and the contact portion associated with the second thermocouple element, the at least one recess having a largest dimension oriented transverse to the second direction of flow.

7. The thermoelectric generator according to claim 1, wherein a thermal resistance of the first contact member is higher in the contact portion associated with the first thermocouple element than the thermal resistance of the first contact member in the contact portion associated with the second thermocouple element.

8. The thermoelectric generator according to claim 1, wherein:
with the first direction of flow and the second direction of flow having a same orientation the thermal resistance of the second contact member is higher in the second contact member contact portion associated with the first thermocouple element than the thermal resistance of the second contact member contact portion associated with the second thermocouple element; and
with the first direction of flow and the second direction of flow having opposite orientations, the thermal resistance of the second contact member is lower in the second contact member contact portion associated with the first thermocouple element than the thermal resistance of the second contact member contact portion associated with the second thermocouple element.

9. The thermoelectric generator according to claim 1, wherein:
the wall of the first flow channel on which the first contact member is disposed is smooth and has no cooling fins; or
the wall of the first flow channel on which the first contact member is disposed has cooling fins evenly distributed along the first direction of flow; or
the wall of the second flow channel on which the second contact member is disposed is smooth and has no cooling fins; or
the wall of the second flow channel on which the second contact member is disposed has cooling fins evenly distributed along the second direction of flow; or
any combination of the wall of the first flow channel on which the first contact member is disposed is smooth and has no cooling fins and the wall of the first flow channel on which the first contact member is disposed has cooling fins evenly distributed along the first direction of flow and the wall of the second flow channel on which the second contact member is disposed is smooth and has no cooling fins and the wall of the second flow channel on which the second contact member is disposed has cooling fins evenly distributed along the second direction of flow.

10. The thermoelectric generator according to claim 1, wherein:
the first contact member provides the first contact member contact portions in a monobloc configuration; or
the second contact member provides the second contact member contact portions in a monobloc configuration; or
the first contact member provides the first contact member contact portions in a monobloc configuration and the second contact member provides the second contact member contact portions in a monobloc configuration.

11. The thermoelectric generator according to claim 1, wherein the plurality of thermocouple elements is disposed as a single layer between the first flow channel and the second flow channel.

12. The thermoelectric generator according to claim 1, wherein:
the first thermocouple element and the second thermocouple element are identical in construction; or
all of the thermocouple elements of the plurality of thermocouple elements are identical in construction.

13. The thermoelectric generator according to claim 1, wherein:
the first contact member is a heat conducting film made of graphite or silicone rubber or polyimide or alumina or micanite or acrylic polymer; or
the second contact member is a heat conducting film made of graphite or silicone rubber or polyimide or alumina or micanite or acrylic polymer; or
the first contact member is a heat conducting film made of graphite or silicone rubber or polyimide or alumina or micanite or acrylic polymer and the second contact member is a heat conducting film made of graphite or silicone rubber or polyimide or alumina or micanite or acrylic polymer.

14. A thermoelectric generator comprising:
a flow channel comprising a wall and having an inlet and an outlet for passing a fluid, the inlet and the outlet of the flow channel defining a direction of flow for the fluid;
a plurality of thermocouple elements disposed next to the flow channel and adjacent to each other along the direction of flow; and
a contact member disposed between the plurality of thermocouple elements and the wall of the flow channel, the contact member comprising contact portions, each of the contact portions being associated with a respective one of the thermocouple elements, the contact portions providing a heat conducting coupling between the respectively associated thermocouple elements and the wall of the flow channel, wherein:
the contact member comprises an isolation region between adjacent contact portions associated with thermocouple elements adjacent each other, a thermal resistance of the isolation region being increased with respect to an average thermal resistance of the adjacent contact portions by at least five times.

15. The thermoelectric generator according to claim 14, wherein the thermocouple elements adjacent each other are configured for different temperature ranges.

16. The thermoelectric generator according to claim 14, wherein the contact member comprises at least one recess between adjacent contact portions associated with thermocouple elements adjacent each other, the at least one recess having a largest dimension oriented transverse to the flow direction.

17. An exhaust system for a vehicle driven by an internal combustion engine, the exhaust system comprising
- a thermoelectric generator, the thermoelectric generator comprising:
- a first flow channel comprising a first flow channel wall and having an inlet and an outlet for passing a warm fluid, the inlet and the outlet of the first flow channel defining a first direction of flow for the warm fluid;
- a second flow channel comprising a second flow channel wall and having an inlet and an outlet for passing a cold fluid, the inlet and the outlet of the second flow channel defining a second direction of flow for the cold fluid;
- a plurality of thermocouple elements disposed between the first flow channel and the second flow channel and being disposed adjacent to each other along the first direction of flow;
- a first contact member disposed between the plurality of thermocouple elements and the first flow channel wall, the first contact member comprising first contact member contact portions, each of the first contact member contact portions being associated with a respective individual one of the thermocouple elements, the first contact member contact portions providing a heat conducting coupling between the respectively associated thermocouple elements and the wall of the first flow channel; and
- a second contact member disposed between the plurality of thermocouple elements and the second flow channel wall, the second contact member comprising second contact member contact portions, each of the second contact member contact portions being associated with a respective individual one of thermocouple elements, the second contact member contact portions providing a heat conducting coupling between the respectively associated thermocouple elements and the wall of the second flow channel, wherein:
- a first thermocouple element of the plurality of thermocouple elements is positioned along the first direction of flow upstream of a second thermocouple element of the plurality of thermocouple elements;
- a sum of thermal resistances of one of the first contact member contact portions associated with the first thermocouple element and one of the second contact member contact portions associated with the first thermocouple element, is larger than a sum of thermal resistances of one of the first contact member contact portions associated with the second thermocouple element and one of the second contact member contact portions associated with the second thermocouple element; and
- the first flow channel is an exhaust gas line of the exhaust system or is configured for being coupled with an exhaust gas line of the exhaust system.

18. A thermoelectric generator contact member comprising:
- a plurality of contact portions configured to provide a heat conducting coupling between a respective associated thermocouple element of a thermoelectric generator and a wall of a fluid flow channel; and
- an isolation region between adjacent contact portions associated with thermocouple elements adjacent each other, a thermal resistance of the isolation region being increased with respect to an average thermal resistance of the adjacent contact portions by at least five times; or
- a recess between adjacent contact portions associated with thermocouple elements adjacent each other, a largest dimension of the recess being oriented in the direction of a separation line between adjacent contact portions; or
- an isolation region between adjacent contact portions associated with thermocouple elements adjacent each other, a thermal resistance of the isolation region being increased with respect to an average thermal resistance of the adjacent contact portions by at least five times and a recess between adjacent contact portions associated with thermocouple elements adjacent each other, a largest dimension of the recess being oriented in the direction of a separation line between adjacent contact portions.

19. The contact member according to claim 18, wherein:
- the contact member has the shape of a rectangle with two long sides in parallel and two short sides in parallel;
- the recess is provided between adjacent contact portions associated with thermocouple elements adjacent each other; and
- the largest dimension of the recess is oriented in parallel to the short sides of the contact member.

20. The contact member according to claim 18, wherein all of the contact portions of the plurality of contact portions are provided in a monobloc configuration; and
the contact portions of the plurality of contact portions are formed by a heat conducting film made of graphite or silicone rubber or polyimide or alumina or micanite or acrylic polymer.

* * * * *